United States Patent [19]

Hausman

[11] 3,805,117

[45] Apr. 16, 1974

[54] HYBRID ELECTRON DEVICE CONTAINING SEMICONDUCTOR CHIPS

[75] Inventor: Earl Thomas Hausman, Somerville, N.J.

[73] Assignee: RCA Corporation, New York, N.Y.

[22] Filed: Dec. 12, 1972

[21] Appl. No.: 314,429

[52] U.S. Cl. ...... 317/101 CP, 29/626, 317/101 CM

[51] Int. Cl. ........................................... H05k 1/04

[58] Field of Search ..............317/101 CM, 101 CP, 317/101 CE; 339/17 C, 17 CF; 29/626

[56] References Cited

UNITED STATES PATENTS

| | | | |
|---|---|---|---|
| 3,142,783 | 7/1964 | Warren | 317/101 CP |
| 3,340,437 | 9/1967 | Fricker | 317/101 CW |
| 3,354,394 | 11/1967 | James | 317/101 CP |

*Primary Examiner*—David Smith, Jr.
*Attorney, Agent, or Firm*—H. Christoffersen; R. P. Williams

[57] ABSTRACT

The device includes a sub-assembly comprising a solid member of insulating material and a number of electronic devices disposed within openings through the solid member. Lead wires of the components extend outwardly of the openings and into holes through a pair of printed circuit board members mounted on opposite sides of the solid member, the lead wires being soldered to various conductive paths on the circuit boards. Spring clips are used to clamp the circuit boards against the solid member, the clips being soldered to various ones of the conductive paths. Semiconductor chips are mounted on the circuit boards after the solder operations, and the sub-assembly is mounted on the terminal leads of a header by welding the leads to various ones of the spring clips.

3 Claims, 2 Drawing Figures

PATENTED APR 16 1974

3,805,117

HYBRID ELECTRON DEVICE CONTAINING SEMICONDUCTOR CHIPS

The invention herein described was made in the course of or under a contract with the Department of the Navy.

This invention relates to electronic devices, and particularly to "hybrid" devices which combine, within a single enclosure, a number of interconnected electronic components, such as "discrete" components and integrated circuits.

Hybrid devices are now well known in the electronics industry and provide advantages of low cost, compact design, and ruggedness. While any number of arrangements exist for assembling various electronic components within a single enclosure, a need exists for improvements in the way various sub-assemblies of such devices are made, tested, and finally assembled in the finished device. The present invention relates to the fabrication of hybrid devices in which semiconductor chips are mounted on a sub-assembly in such manner to avoid damage to the delicate chips and to facilitate testing of the sub-assembly prior to incorporation thereof into the final enclosure.

DETAILED DESCRIPTION OF THE INVENTION

Figures 1, 2:
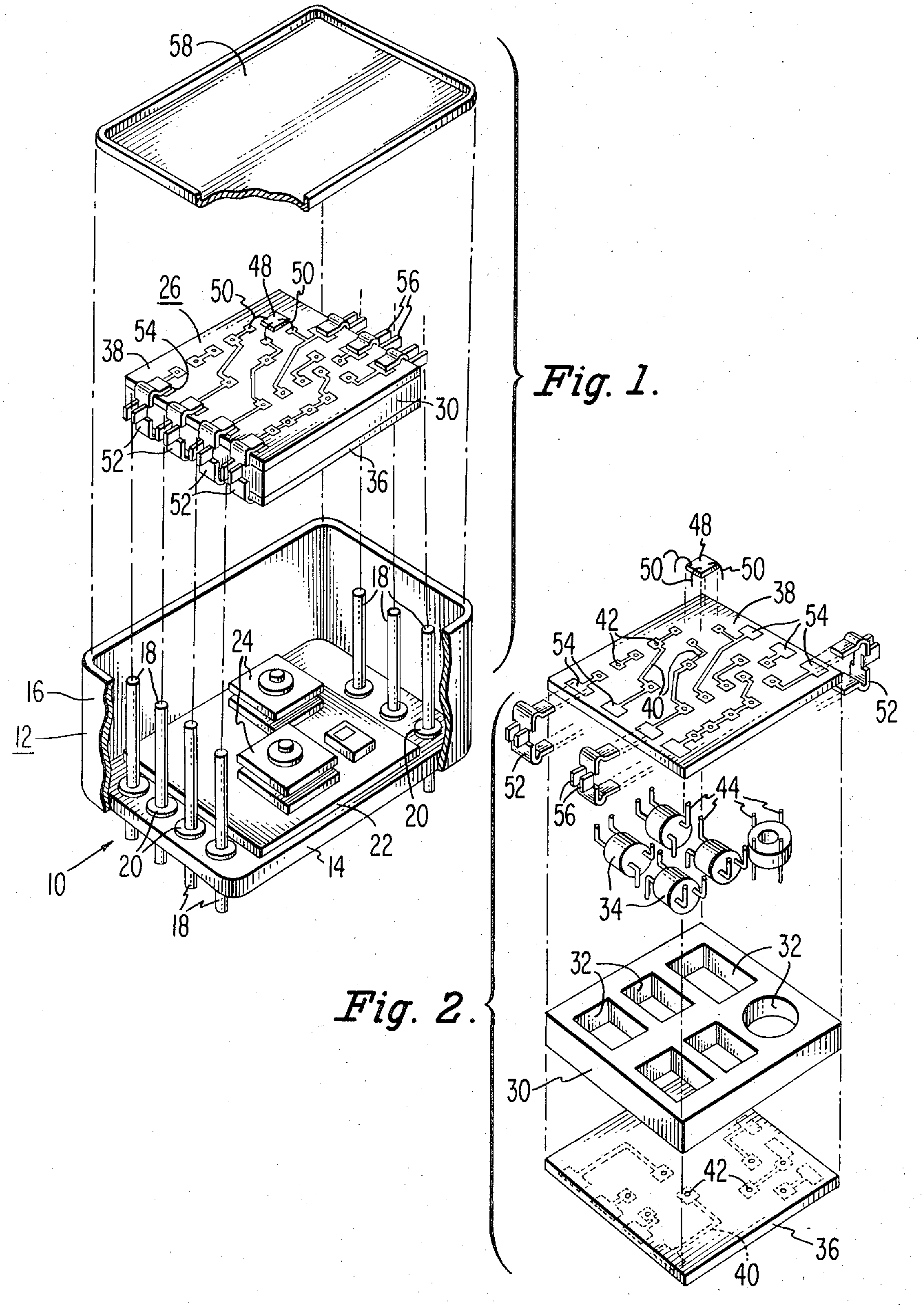
FIG. 1 is an exploded view, in perspective, of a hybrid device in accordance with this invention.
FIG. 2 is an exploded view, in perspective, of a sub-assembly of the device shown in FIG. 1.

With reference to FIG. 1, a hybrid device 10 in accordance with the instant invention includes a known type header 12 comprising a cup-shaped member of metal, e.g., steel, having a flat bottom plate 14, an upwardly extending side wall 16, and a number of terminal leads 18 passing through the bottom plate. The leads are hermetically sealed to the bottom plate and electrically isolated therefrom by means of glass eyelets 20.

Although not an essential feature of the instant invention, various members can be mounted inside the header on the bottom plate 14. Thus, by way of example only, mounted on the bottom plate 14 is an insulator member 22, e.g., of alumina ceramic, on which a number of discrete components 24, e.g., power transistors, are mounted. Means for providing these and other components on a header are well known, hence, no further description thereof is provided.

Mounted on the terminal leads 18 in spaced relation with the components 24 is a sub-assembly 26 comprising, as shown in FIG. 2, a solid member 30 having a number of openings 32 therethrough, various components 34 which are disposed within the openings, and a pair of printed circuit boards 36 and 38 which are mounted on opposite sides of the solid member 30. The components 34 can be any of a variety of electronic components such as resistors, capacitors, inductors, transformers and the like, the particular components used depending upon the particular hybrid device being made.

Each board 36 and 38 has a thick film circuit printed on at least one face thereof, i.e., a pattern of conductive paths 40 including, if desired, such thick film components as resistors and capacitors. The printed circuit boards can be of conventional type known, for example, in the television receiving chassis arts, and can comprise a member of alumina ceramic having conductive paths 40 of platinum gold, palladium silver, or any other thick film conductor material provided thereon by known photolithographic processes.

Each board 36 and 38 has a number of openings 42 therethrough intersecting various ones of the conductive paths 40 on the boards. Lead wires 44 from the various components 34 within the solid member 30 extend outwardly from the openings 32 and into the circuit board openings 42 where the wires are electrically connected, by solder joints, as described hereinafter, to various ones of the paths 40 on the boards.

In addition to the components 34 within the solid member 30, a number of semiconductor chips 48 (only one being shown), of known type, depending on the particular device being made, are mounted on one or both outwardly facing surfaces of the sub-assembly circuit boards 36 and 38. The semiconductor chips 48 are preferably cemented in place, as by means of a suitable epoxy cement, and fine wires 50 are used for interconnecting various terminal regions on the semiconductor chips 48 with various ones of the conductive paths 40 on the circuit boards 36 and 38.

For rigidly securing the circuit boards 36 and 38 to the solid member 30, as well as providing means for mounting the sub-assembly 26 on the terminal leads 18, a number of spring clips 52 of, e.g., nickel, spring steel, spring copper, are used. As shown, the clips 52 are generally of U-shape and are of such size as to provide compressive pressure against the circuit boards 36 and 38 when the clips are snapped in place on the sub-assembly 26. The clips 52 are soldered to metallic bonding pads 54 on the circuit boards 36 and 38 which are connected to various ones of the conductive paths 40 on the boards. To facilitate soldering of the clips 52 to the bonding pads 54, the pads 54, of the same material as the conductive paths 40, preferably are overcoated with a thin layer of gold.

Also, each clip 52 is provided with a pair of rearwardly extending flaps 56 which are disposed about and bonded, for example to the different welded terminel leads 18, thus providing terminal connecting means for the various circuits and components of the sub-assembly 26.

A cover 58, of, e.g., steel, is secured to the top surface 58 of the header side wall 16 to complete the enclosure of the device 10.

Assembly of the device 10 is as follows.

The solid member 30 is first disposed on the circuit board 36 in accurate registration therewith, using suitable jigs, not shown, the various components 34 are placed in the various openings 32 through the solid member 30, and various ones of the lead wires 44 of the components are threaded into various ones of the openings 42 in this board. The other circuit board 38 is then mounted in place by aligning it with others of the lead wires 44 of the components 34 within the solid member 30, and these lead wires 44 are threaded into the various openings 42 in this board.

The two boards 36 and 38 are pressed firmly in place against the top and bottom surfaces of the solid member 30, the various components 34 being contained entirely between these surfaces within the solid member, and the various clips 52 are snapped in place about the edges of the sub-assembly 26.

Using known soldering techniques, e.g., a simple soldering iron and solder, each of the component lead wires 44 is soldered to the printed conductive path 40 intersected by the circuit board opening 42 in which the lead is disposed. The fit of the lead wires 44 within the circuit board openings 42 is relatively tight, whereby good contacting of the solder with the lead wires 44 within the openings 42 and with the conductive material of the paths 40 surrounding the holes 42 is readily obtained. Also, the various clips 52 are soldered to the circuit board bonding pads 54 disposed thereunder.

The soldering procedure can also be performed by providing, in accordance with known techniques, platings or coatings of solder on various ones of the clips 52, the bonding pads 54, the component lead wires 44, and on the portions of the conductive paths 40 surrounding the circuit board openings 42. The sub-assembly 26 is then placed in an oven to melt the solder coatings to flow the solder to make simultaneously the various solder joints.

Thereafter, the sub-assembly is cleaned of all residues of the soldering operation. That is, in a soldering procedure, as generally known, various fluxes are used to promote wetting of the various members to be bonded by the solder. These fluxes, plus the various oxides created during the elevated temperature soldering process, must be cleaned from the sub-assembly. The fluxes, for example, are chemically corrosive and would adversely affect the delicate semiconductor chips later to be added to the sub-assembly. The oxide coatings interfere with subsequent bonding operations.

The cleaning process may include bathing the sub-assembly in successive baths of trichlorethylene and methanol, and then heating the sub-assembly to drive-off the methanol. Preferably, the baths are ultrasonically vibrated to improve the cleaning efficiency thereof.

Of importance with respect to the instant invention is the fact that at this point in the fabrication of the device, because of the absence of any semiconductor chips, the soldering process has no ill effects on the sub-assembly. That is, in various prior art processes of assembling hybrid devices of the type including semiconductor chips, various sub-assemblies, including the semiconductor chips, are soldered in place and then subjected to the flux-cleaning procedure. Such soldering procedures, I have determined, can be quite harmful to the semiconductor chips owing to the highly corrosive nature of the fluxes used, and the need to use harsh chemicals in the subsequent cleaning procedures.

In accordance with the instant invention, however, both the soldering and flux-cleaning procedures are done prior to the addition of the semiconductor chips 48 to the sub-assembly 26, hence the chips are not exposed to these procedures.

For mounting the semiconductor chips 48 on the circuit boards 36 and 38, the chips 48 are preferably cemented in place using, for example, known epoxy cements which cure at relatively low temperature, e.g., 135°C. The cementing of semiconductor chips on supporting members is well known. Then, the various chip interconnecting wires 50 are provided using known wire bonding techniques, e.g., thermo-compression wire bonding.

At this point, a rigid, self-supporting sub-assembly has been completed which can be readily handled and tested with little damage or harm thereto.

Thereafter, the sub-assembly 26 is mounted within the header 12 by threading the terminal leads 18 between each pair of flaps 56 of each of the clips 52, as shown in FIG. 1. Preferably, the distance between the flaps 56 is substantially equal to the diameter of the terminal leads 18, whereby the sub-assembly 26 is force-fitted onto the terminal leads and can be stationed in spaced relation above the header plate 14 and out of contact with the components on the bottom plate.

Then, the flaps 56 are welded to the terminel leads 18 using, for example, well known "tweezer" welders.

Finally, the cover 58 is mounted on the top end of the header sidewall 16 and sealed thereto, as by conventional welding techniques.

I claim:

1. An electronic device comprising:

a member of insulating material having a pair of surfaces, and spaced apart openings through said member between said surfaces, electronic components disposed within said openings and having lead wires extending beyond said member from said openings, a pair of circuit boards at least one having a pattern of conductive paths on a surface thereof and openings through said board intersecting various ones of said paths, said boards being mounted on said member surfaces with said lead wires extending into said board openings and being electrically connected to various ones of said paths, spring clips clamping said boards against said insulating member, said clips being electrically connected to different ones of said conductive paths, and terminal leads for said device bonded to different ones of said clips.

2. A method of assembling an electron device comprising:

providing a sub-assembly by disposing various electrical components within openings through an insulating member, threading lead wires of said components through openings of circuit board members having conductive paths intersected by said board openings, clamping said circuit boards against said member, and soldering said lead wires to said conductive paths, and thereafter mounting semiconductor chips on at least one of said boards, electrically connecting said chips with various ones of said conductive paths by processes other than soldering processes and providing terminal connections to said conductive paths using bonding processes other than soldering processes.

3. A method as in claim 2 wherein said clamping step comprises disposing compressive spring clips about the periphery of said boards, said connecting step comprises bonding fine wires between said semiconductor chips and said conductive paths, and said terminal providing step comprises welding terminal leads to various ones of said spring clips.

* * * * *